United States Patent [19]

Wichern et al.

[11] Patent Number: 4,998,066
[45] Date of Patent: Mar. 5, 1991

[54] MR EXAMINATION APPARATUS COMPRISING A CIRCUIT FOR DECOUPLING THE TWO COIL SYSTEMS OF A QUADRATURE COIL ARRANGEMENT

[75] Inventors: Andreas H. W. Wichern; Christoph G. Leussler, both of Hamburg, Fed. Rep. of Germany

[73] Assignee: U.S. Philips Corporation, New York, N.Y.

[21] Appl. No.: 366,104

[22] Filed: Jun. 13, 1989

[30] Foreign Application Priority Data

Jun. 14, 1988 [DE] Fed. Rep. of Germany ....... 3820168

[51] Int. Cl.⁵ .......................................... G01R 33/20
[52] U.S. Cl. ..................................... 324/322; 333/219
[58] Field of Search ............... 324/300, 307, 309, 310, 324/311, 312, 313, 318, 322; 128/653; 333/219, 223, 235

[56] References Cited

U.S. PATENT DOCUMENTS

| 4,594,566 | 6/1986 | Maudsley | 324/307 |
| 4,707,664 | 11/1987 | Fehn et al. | 324/322 |
| 4,752,736 | 6/1988 | Arakawa | 324/322 |
| 4,763,074 | 8/1988 | Fox | 324/314 |

FOREIGN PATENT DOCUMENTS 0071896 5/1986 European Pat. Off. .

OTHER PUBLICATIONS

T. R. Fox, Capacitive Network to Cancel Coupling Between Channels in MRI Quadrature Antenna, Conf. Proc. of S.M.R.M., (1987), p. 99.

Primary Examiner—Michael J. Tokar
Attorney, Agent, or Firm—William Squire

[57] ABSTRACT

An MR examination apparatus has a quadrature coil arrangement which consists of two coil systems and a circuit for decoupling the two coil systems. In such an MR examination apparatus the decoupling between the coil systems is improved in that the circuit comprises a variable capacitor which connects one coil system to the other.

7 Claims, 2 Drawing Sheets

MR EXAMINATION APPARATUS COMPRISING A CIRCUIT FOR DECOUPLING THE TWO COIL SYSTEMS OF A QUADRATURE COIL ARRANGEMENT

BACKGROUND OF THE INVENTION

1. Field of the Invention

The invention relates to an MR examination apparatus, comprising a quadrature coil arrangement which consists of two coil systems and a circuit for decoupling the two coil systems.

Of interest is commonly owned co-pending application entitled "RF Quadrature Coil System for an MRI Apparatus", Ser. No. 366,101, filed concurrently herewith by the present inventors.

2. Description of the Prior Art

An MR examination apparatus of the kind is known from the publication by T. R. Fox in the conference proceedings of the Society for Magnetic Resonance in Medicine (SMRM) 1987, page 99. Therein, the two coil systems are coupled to one another via a capacitive voltage divider. For suitable operation of the decoupling circuit it is necessary that the coupling factor is smaller than 0.1%. Moreover, the circuit operates only at frequencies below 10 MHz and has only a limited decoupling effect.

SUMMARY OF THE INVENTION

It is an object of the present invention to construct MR examination apparatus of the kind set forth so that effective decoupling between the coil systems of a quadrature coil arrangement is achieved at little expenditure. This object is achieved in accordance with the invention in that the circuit comprises a variable capacitor which connects one coil system to the other. The capacitor produces an rf current whose direction opposes that of the rf current imposed by the coupling. This current can be adjusted by variation of the capacitance of this capacitor so that optimum decoupling is obtained.

BRIEF DESCRIPTION OF THE DRAWING

The invention will be described in detail hereinafter with reference to the drawing wherein.

DETAILED DESCRIPTION OF THE PREFERRED EMBODIMENTS

Figure 1A:
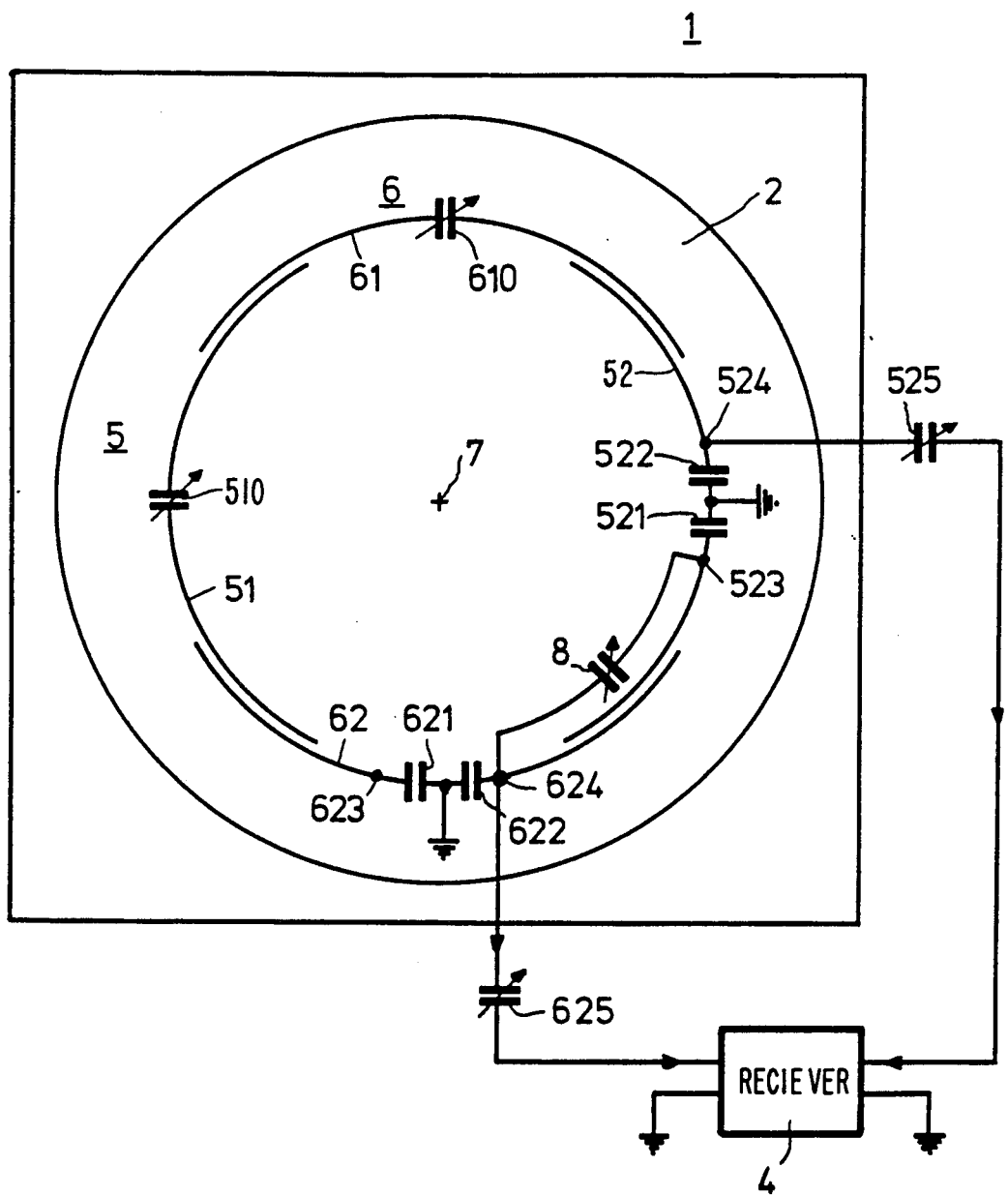
FIG. 1a is a schematic front view and block diagram of the MR apparatus according to the invention including a quadrature coil arrangement.

FIG. 1a of the drawing shows a block diagram with the components of an MR examination apparatus 1 which are essential to the invention. In its examination zone 2 the MR examination apparatus generates a steady, uniform magnetic field which extends perpendicularly to the plane of FIG. 1a and which has a magnetic flux density of, for example 0.5 T. Consequently, in the examination zone a Larmor frequency of approximately 21.3 MHz occurs for hydrogen protons. The nuclear spins of the hydrogen protons in the examination zone can be excited by an rf magnetic field which extends perpendicularly to the steady magnetic field and which has exactly this Larmor frequency. The spin resonance signals thus generated in the examination zone induce two signals in a quadrature coil arrangement, which signals are applied to a receiver 4. For the sake of clarity, the components of the MR examination apparatus which are necessary for the further processing of these signals have been omitted in the drawing.

Figure 1B:
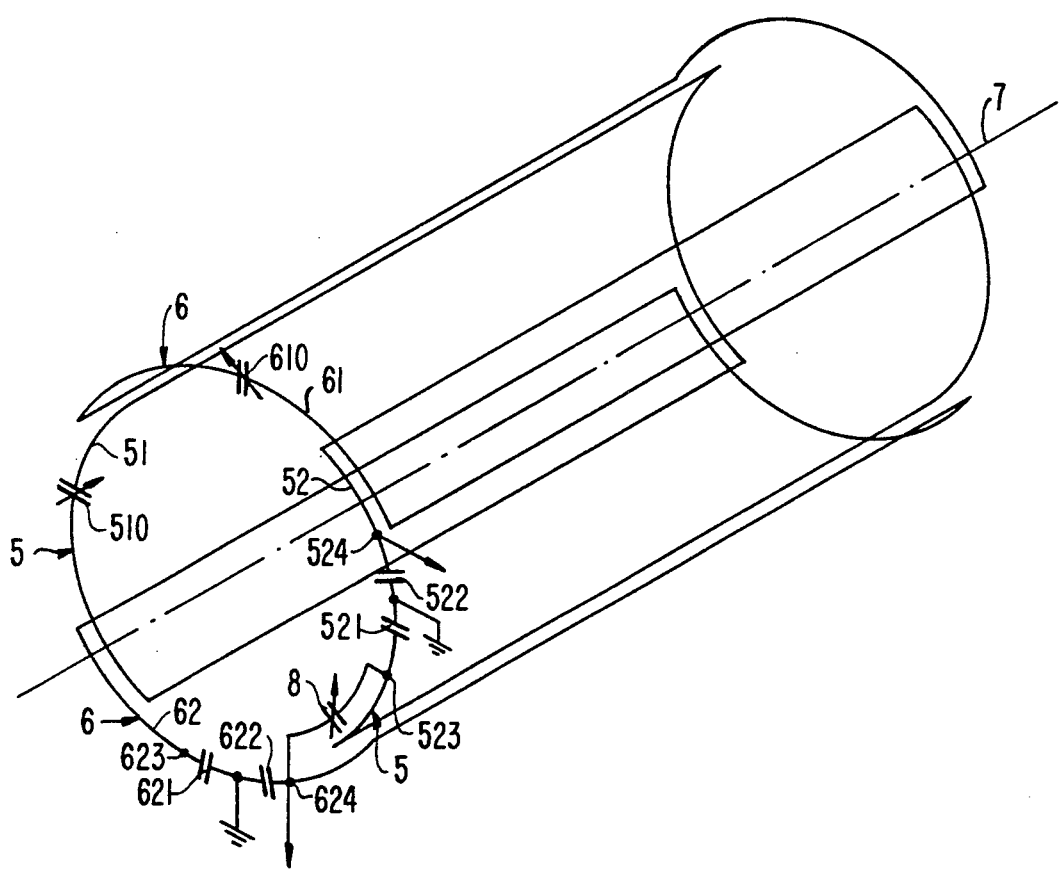
FIG. 1b is a schematic isometric view of the quadrature coil arrangement in FIG. 1.

The quadrature coil arrangement as is also apparent from FIG. 1b, comprises two quadrature coil systems 5 and 6 which have been offset 90° with respect to one another. Each quadrature coil system consists of two coils 51, 52 and 61, 62, respectively, which have been offset 180° with respect to one another. Each coil comprises two arc-shaped conductor sections which have been offset in the direction of the central axis 7 of the MR apparatus and which describe an arc of approximately 120° about central axis 7, said conductor sections being complemented so as to form a loop by two straight conductor sections which extend parallel to central axis 7.

All coils of the quadrature coil arrangement are tuned to the same resonance frequency. Each time only one of the coils of a coil system, in this case the coils 62 and 52, can be connected to the receiver 4; therefore the other coils 51 and 61 are only inductively coupled.

The coils 51 and 61 which are not connected to the receiver 4 are tuned by means of a capacitor 510, 610, respectively, in the center of the arc-shaped conductor section (or in the center of the two arc-shaped conductor sections). For the coils 52 and 62 which can be connected to the receiver in the center there are provided two series-connected capacitors 521, 522 and 621, 622 the junction points thereof being each time connected to ground. One of the two junctions points 523, 524 or 623, 624 between the series-connected capacitors and the arc-shaped conductor sections, (in this case the connections 523 and 624), can be connected to the inputs of the receiver 4 via tunable capacitors 525 and 625, respectively, and switches (not shown). The sum of the capacitances of the interconnected capacitors 522 and 523, 622 and 625 corresponds approximately to the capacitance of the second capacitor 521 (or 621), so that a symmetrical field distribution is also obtained with respect to the central plane of the coils 52 and 62.

Because each individual coil covers a 120° arc of a cylindrical surface, between the individual coils, comparatively large overlapping zones are obtained (30°) which themselves produce a coupling between the coils. However, the linking of the magnetic flux produced by the two overlapping zones between each coil and the other two coils of each time the other coil systems are oppositely directed, so that in the ideal case the coils are decoupled from one another. In practice, however, coupling effects occur between the neighbouring coil systems due to small symmetry errors in the coil geometry, but notably due to a non-symmetrical field distribution on the coils which itself is caused by non-exact tuning. Even when the coupling factor amounts to only a fraction of one percent, it almost fully cancels the improvement of the signal-to-noise ratio, amounting to at the most 3 dB, which can be achieved by means of a quadrature coil arrangement in comparison with a single coil system. Therefore, it is important to decouple the two coils as well as possible.

To this end there is provided a capacitor 8 which is connected between the connection points 523 and 624 of the coils 52 and 62. This capacitor produces a current whose direction opposes that of the rf current imposed by the coupling between the coils and which, therefore, at least substantially compensates for this current. The capacitance required for optimum decoupling by way of this capacitor can be determined by connecting one of the coils 52 or 62 to an rf generator and by measuring the voltage thus induced in the other coil, the capacitor being varied until the voltage measured reaches a minimum value.

The induced voltage can be measured either directly or by arranging on the symmetry axis a small pick-up coil (i.e. a non-resonant pick-up coil) having a frame extending perpendicularly to the coils 51, 52 (when the coil 52 is connected to the rf generator) and by measuring the voltage induced at that area. The same effect is obtained when the capacitor 8 is connected between the connections 524 and 623 instead of between the connections 523 and 624.

The direction of the current produced in a coil by the coupling of the coils depends on the non-symmetry in the coil geometry and in the field distribution on the coils. Therefore, it may occur that the current produced by the coupling does not flow in the assumed direction; in that case the described used of the capacitor 8 would even intensify the coupling between the two coil systems. Therefore, in such cases the capacitor 8 should be connected either between the connections 523 and 623 or between the connections 524 and 624.

In a coil system of the kind shown in the drawing which has been treated in practice at a frequency of 21.3 MHz, the coupling could be reduced by more than 30 dB by means of a capacitor which was in any case smaller than 15 Pf (without compensation, the coupling factor amounted to 0024). This means that, when for example the coil 52 is powered in the described manner in the center of the quadrature coil arrangement by means of a pick-up coil, the voltage measured can be reduced by more than 30 dB in comparison with the situation without the capacitor 8.

The invention has been described with reference to a quadrature coil arrangement in which each time only one of the two coils of a coil system can be connected to the rf transmitter or rf receiver; however, the invention can also be used for quadrature coil arrangements in which each of the two coils of a coil system is connected to the transmitter or the receiver, see EP-OS 71 896. Finally, the invention can also be used in quadrature coil arrangements in which each coil system consists of only one rf coil. The circuit can in principle be used in any quadrature coil arrangement in which the power supply lead is also connectable via two series-connected capacitances.

We claim:

1. Radio frequency (rf) quadrature coil construction for an NMR examination apparatus comprising:
    a first coil system;
    a second coil system arranged with the first system for rf quadrature operation in said apparatus;
    tuning means connected to each said system including a pair of series connected capacitances with the junction therebetween connected to an reference potential; and
    capacitance means connected to said tuning means of said first and second systems for decoupling said first and second systems.

2. The construction of claim 1 wherein each coil system comprises a pair of opposing coils, each system being orientated 90 degrees relative to the other system, said tuning means being connected to one coil of each tuning means.

3. The coil construction of claim 2 wherein the capacitance means is a variable capacitor.

4. The coil construction of claim 1 further including an input/output capacitance coupled to one of said series connected capacitances of each system, the sum of the input/output capacitance coupled to said one series connected capacitance and that one series connected capacitance having a combined capacitance of about that of the other capacitance of that pair.

5. The coil construction of claim 4 wherein said input/output capacitance and capacitance means are each variable capacitances.

6. The coil construction of claim 1 wherein each coil system comprises a pair of coils offset 180° on the circumference of a cylinder and tuned to the same frequency, one coil of each system having two connection points, one point for connection to an rf transmitter or receiver, the other point for connecting said capacitance means to said one coil of each system.

7. The coil construction of claim 6 wherein said two connection points are located with said tuning means therebetween.

* * * * *